United States Patent
Hongming

(10) Patent No.: US 11,393,944 B2
(45) Date of Patent: Jul. 19, 2022

(54) METHOD FOR IMPROVING OHMIC CONTACT BEHAVIOUR BETWEEN A CONTACT GRID AND AN EMITTER LAYER OF A SILICON SOLAR CELL

(71) Applicant: CE Cell Engineering GmbH, Kabelsketal (DE)

(72) Inventor: Zhao Hongming, Halle/Saale (DE)

(73) Assignee: CE CELL ENGINEERING GMBH, Kabelsketal (DE)

( * ) Notice: Subject to any disclaimer, the term of this patent is extended or adjusted under 35 U.S.C. 154(b) by 638 days.

(21) Appl. No.: 16/317,979

(22) PCT Filed: Aug. 1, 2017

(86) PCT No.: PCT/DE2017/000245
§ 371 (c)(1),
(2) Date: Jan. 15, 2019

(87) PCT Pub. No.: WO2018/024274
PCT Pub. Date: Feb. 8, 2018

(65) Prior Publication Data
US 2021/0288208 A1    Sep. 16, 2021

(30) Foreign Application Priority Data
Aug. 2, 2016 (DE) .......................... 102016009560.1

(51) Int. Cl.
*H01L 31/18* (2006.01)
*H01L 31/0224* (2006.01)
(Continued)

(52) U.S. Cl.
CPC .. *H01L 31/1864* (2013.01); *H01L 31/022441* (2013.01); *H01L 31/0516* (2013.01);
(Continued)

(58) Field of Classification Search
CPC ............. H01L 31/1864; H01L 31/0516; H01L 31/022441; H01L 31/0682; H01L 31/068;
(Continued)

(56) References Cited

U.S. PATENT DOCUMENTS 9,202,964 B2    12/2015   Edmonson et al.
2011/0306163 A1  12/2011   Song et al.
(Continued)

FOREIGN PATENT DOCUMENTS

EP    0087776 A2    9/1983

OTHER PUBLICATIONS

International Search Report issued in PCT/DE2017/000245 dated Nov. 24, 2017.

*Primary Examiner* — Ermias T Woldegeorgis
(74) *Attorney, Agent, or Firm* — Blank Rome LLP

(57) ABSTRACT

The invention relates to a method for improving ohmic contact behaviour between a contact grid and an emitter layer of a silicon solar cell. The object of the invention is to propose a method for improving contact behaviour between the contact grid and the emitter layer of silicon solar cells, which method is used after the contacting of these solar cells and thus reduces the scrap quota of solar cells with faulty contacting. In order to achieve this object, a method is proposed which has the following method steps. First a silicon solar cell (1) is provided with the emitter layer, the contact grid (5) and a back contact (3). Then the contact grid (5) is electrically contacted by a contact pin matrix (8) or contact plate connected to one terminal of a current source and the back contact (3) is electrically connected by a contact device connected to the other terminal of the current source. Using the current source, at least one current pulse is induced along the forward direction of the silicon solar cell (1), the current pulse having a pulse duration of 1 ms to
(Continued)

Figure 1:
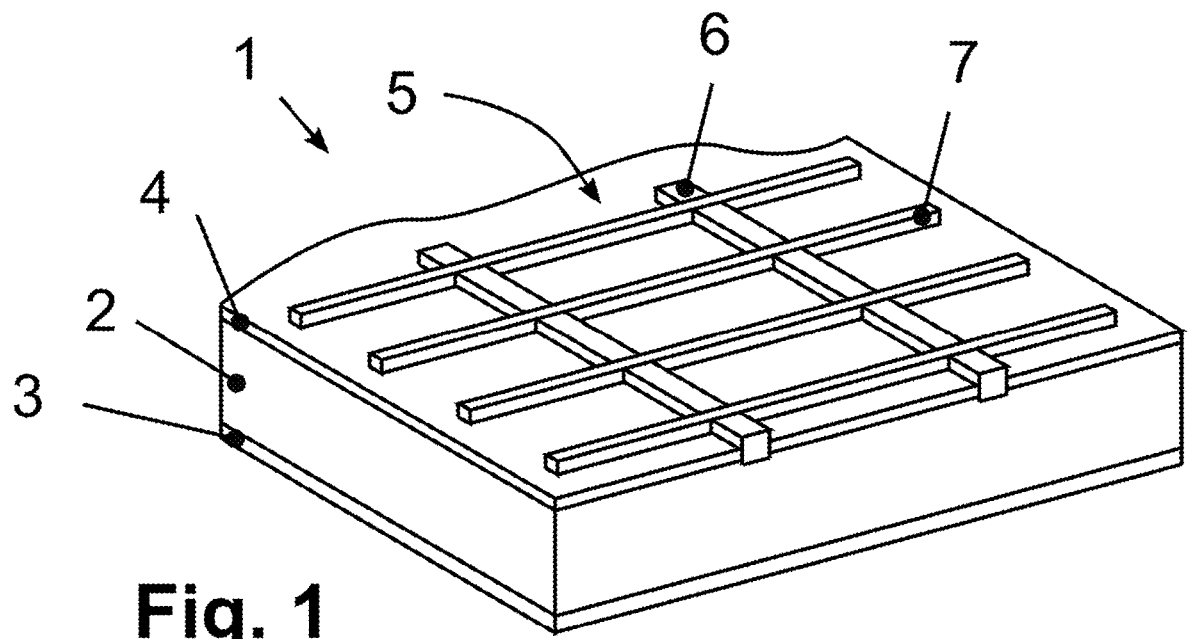

100 ms and a current strength which is equivalent to 10 to 30 times the short-circuit current strength of the silicon solar cell (1). Two alternative methods are also proposed.

5 Claims, 3 Drawing Sheets

(51) Int. Cl.
 *H01L 31/05* (2014.01)
 *H01L 31/068* (2012.01)
(52) U.S. Cl.
 CPC ........ *H01L 31/068* (2013.01); *H01L 31/1804* (2013.01); *H01L 31/0682* (2013.01)
(58) Field of Classification Search
 CPC ............. H01L 31/022425; H01L 31/12; H01L 31/1804; Y02E 10/547
 See application file for complete search history.

(56) References Cited

U.S. PATENT DOCUMENTS

| | | | |
|---|---|---|---|
| 2012/0028396 A1* | 2/2012 | Gilman | ............... H01L 31/1804 438/64 |
| 2013/0146576 A1 | 6/2013 | Khan et al. | |
| 2014/0069494 A1 | 3/2014 | Liu et al. | |
| 2014/0139249 A1* | 5/2014 | Dobson | .............. G01R 1/06711 324/755.01 |

* cited by examiner

METHOD FOR IMPROVING OHMIC CONTACT BEHAVIOUR BETWEEN A CONTACT GRID AND AN EMITTER LAYER OF A SILICON SOLAR CELL

This application is a national stage of International Patent Application No. PCT/DE2017/000245, filed Aug. 1, 2017, which claims the benefit of Germany Application No. 10 2016 009 560.1, filed Aug. 2, 2016, each of which are hereby incorporated by reference in their entirety.

The invention relates to a method for improving the ohmic-contact behaviour between a contact grid and an emitter layer of a silicon solar cell.

As part of the manufacturing process of crystalline silicon solar cells, a metal paste is silk-screened onto the dielectric silicon-nitride-coated front side in the form of a contact grid. For contacting the emitter layer of the silicon solar cell lying below the silicon-nitride layer, a tempering step is carried out at 800-900° C. after applying the metal paste. In this step, the silver of the metal paste diffuses through the silicon-nitride layer into the emitter layer aided by a glass frit in the metal paste. The process control during the tempering step has a critical influence on contact formation. With correct process control, the transition between the contact grid and the emitter layer is characterized by a low contact resistance. With incorrect process control, only a high contact resistance is usually achieved. If, for example, the temperatures used in the tempering step are too low, the metal paste cannot diffuse sufficiently through the silicon-nitride layer so that only a small contact area and thus a high contact resistance forms between the contact grid and the emitter layer. High contact resistances lead, in turn, to a considerable reduction in the efficiency of solar cells, so that they cannot be installed in solar modules and are therefore rejects.

Within the prior art, individual methods are known that permit the efficiency stabilization or performance improvement of solar cells. DE 10 2011 056 843 A1, for example, describes a method for "stabilization of an efficiency of silicon solar cells". To produce a solar module, the solar cells are first wired together electrically to form a network and then bonded between two glass panes or between a glass pane and a rear-side film in a lamination process. The document cited proposes applying a continuous flow of current into the solar cell group during the lamination process and thus creating excess minority carriers. The magnitude of the applied current here is below the simple short-circuit current magnitude for the silicon solar cells. A method of this type essentially breaks down boron-oxygen complexes in the silicon material.

An effect on the contact resistance between the contact grid and the emitter layer is not described.

U.S. Pat. No. 4,166,918 A proposes a method for improving the performance of a solar cell, wherein the solar cell is subjected to a voltage applied contrary to its forward direction. This stimulates flow of current along short-circuits within the solar cell, whereby these areas of the solar cell are heated up and the short-circuits "burnt out" and thus eliminated. No effect on the transition between the contact grid and the emitter layer is described in this method either.

DD 250 247 A3 describes a method for improving the resistive contact behaviour of chip-bonded semiconductor bodies. These semiconductor bodies are fixed to a carrier material by means of an electrically conductive adhesive and contacted with a wire bond. The semiconductor body is subjected to a rectified electrical pulse by applying a voltage pulse between the substrate and the bonding wire. This improves the ohmic-contact behaviour between the substrate and the semiconductor body and therefore reduces the number of rejects. The mode of action of the contact improvement is not described in further detail in the document. The electrically conductive adhesives used for contacting consist essentially of electrically conductive particles, usually silver balls or silver flakes, which are surrounded by a polymer matrix. The contact behaviour is then critically influenced by how many particles have direct contact with the contacted surface. Direct contact of a particle with the surface can be prevented here by an intermediate polymer layer. It is likely that, in the method described, such an intermediate layer is "burnt off" by the application of a current pulse and the particles then have direct contact with the surface. However, this type of intermediate polymer layer is not present at the transition between the contact grid and the emitter layer of a silicon solar cell. The current magnitudes used for the method are in the range of the load limit for chip-bonded semiconductor bodies, for which current magnitudes of around 1 A are specified. During the operation of solar cells sized 15 cm×15 cm, current magnitudes of the order of 5 A to 10 A, and thus much higher current strengths, are usually achieved. No effect on the transition between the contact grid and the emitter layer of a silicon solar cell is known at these current strengths.

The object of the invention is to propose a method for improving the contact behaviour between the contact grid and the emitter layer of silicon solar cells that is applied after contacting these solar cells and thus reduces the number of rejected solar cells with defective contacting.

This object is resolved by applying a method characterized by the following steps. First, a silicon solar cell is prepared with the emitter layer, the contact grid and a rear contact. Then, the contact grid is contacted electrically by a first contacting device connected to one pole of a current source, while the rear contact is electrically connected to a second contacting device connected to the other pole of the current source. Then, at least one current pulse with a pulse length of 1 ms to 100 ms and a current magnitude corresponding to 10-to-30 times the short-circuit current magnitude for the silicon solar cell is induced along the forward direction of the silicon solar cell by means of the current source.

The first contacting device preferably has the form of a contact-pin matrix or a contact plate.

Alternatively, a method characterized by the following steps is suggested: First, a silicon solar cell is prepared with the emitter layer, the contact grid and a rear contact. Then a subsection of the contact grid is contacted electrically by a contact brush or contact roller connected to one pole of a current source and the rear contact is connected electrically by a contacting device connected to the other pole of the current source. The contact brush or the contact roller are then passed over the contact grid, whereby the current source induces a current along the forward direction of the silicon solar cell that has a current magnitude corresponding to 10-to-30 times the short-circuit current strength of the silicon solar cell reduced by the ratio of the area of the subsection to the area of the silicon solar cell. This current flows through each subsection for a duration of between 1 ms and 100 ms. This can be achieved either by current pulses with the appropriate pulse lengths being generated by the current source or by selecting the rate of forward motion of the contact roller or contact brush such that, with a continuous current flow provided by the current source, the current flows through each section for around 1 ms to 100 ms.

A further alternative method is characterized by the following process steps: First, a silicon solar cell is prepared with the emitter layer, the contact grid and a rear contact. The contact grid is connected electrically to one pole of a voltage source and the rear contact is electrically connected by a contacting device connected to the other pole of the voltage source. A voltage is then applied opposite to the forward direction of the silicon solar cell by the voltage source. While this voltage is applied, a point light source is guided over the sun-facing side of the silicon solar cell. The applied voltage and the point light source are chosen such that a current flow is induced in the subsection, whereby this current flow acts on the subsection for 1 ms to 100 ms and the current has a magnitude corresponding to 10-to-30 times the short-circuit strength of the silicon solar cell reduced by the ratio of the area of the subsection to the area of the silicon solar cell measured under standard test conditions. This point light source locally shifts the characteristic curve of the solar cell such that a current can flow in the illuminated area of the silicon solar cell. The exposure times of 1 ms to 100 ms can be achieved by the point light source generating appropriately pulsed radiation or by the point light source emitting continuous radiation and being passed over the sun-facing side of the silicon solar cell sun at an appropriate rate of forward motion.

In one advantageous embodiment, the point light source is a laser.

By applying one of the methods according to the invention, the ohmic-contact behaviour in silicon solar cells with high contact resistance between the contact grid and the emitter layer is considerably improved. By reducing an initially high contact resistance between the contact grid and the emitter layer, the efficiency of these silicon solar cells is considerably increased such that they do not have to be rejected as waste. The method is therefore suitable for increasing the yield after the manufacturing process itself. The method can be applied by the manufacturer of the silicon solar cells or by a third party that improves the defective silicon solar cells by the method according to the invention.

However, the incorporation of the method according to the invention as part of the manufacturing process is also conceivable. This has the advantage that the process control of the tempering step does not have to be quite as strictly compliant and a high contact resistance due to poor diffusion of the metal paste is initially accepted and corrected in a later process step by the method according to the invention. This can minimize the efforts required for process inspection and process regulation. It is also possible to introduce generally lower temperatures during the tempering step and thus to achieve an initially only small contact area between the contact grid and the emitter layer. The contact area can then be further increased by subsequently applying the method according to the invention. It is also conceivable to reduce the doping of the emitter for improved light input and yet still achieve a lower contact resistance by applying the method according to the invention.

The contact-pin matrix or the contact plate or the guided contact brush or contact roller ensure a homogeneous application of the current pulses over the area of the silicon solar cell. In particular by using the local light source, not only homogeneous application of the current can be achieved: the application of current can also be controlled specifically according to specified patterns.

Embodiments of the invention are explained by means of drawings below. These show:

FIG. 1 A schematic diagram of a silicon solar cell

Figure 2:
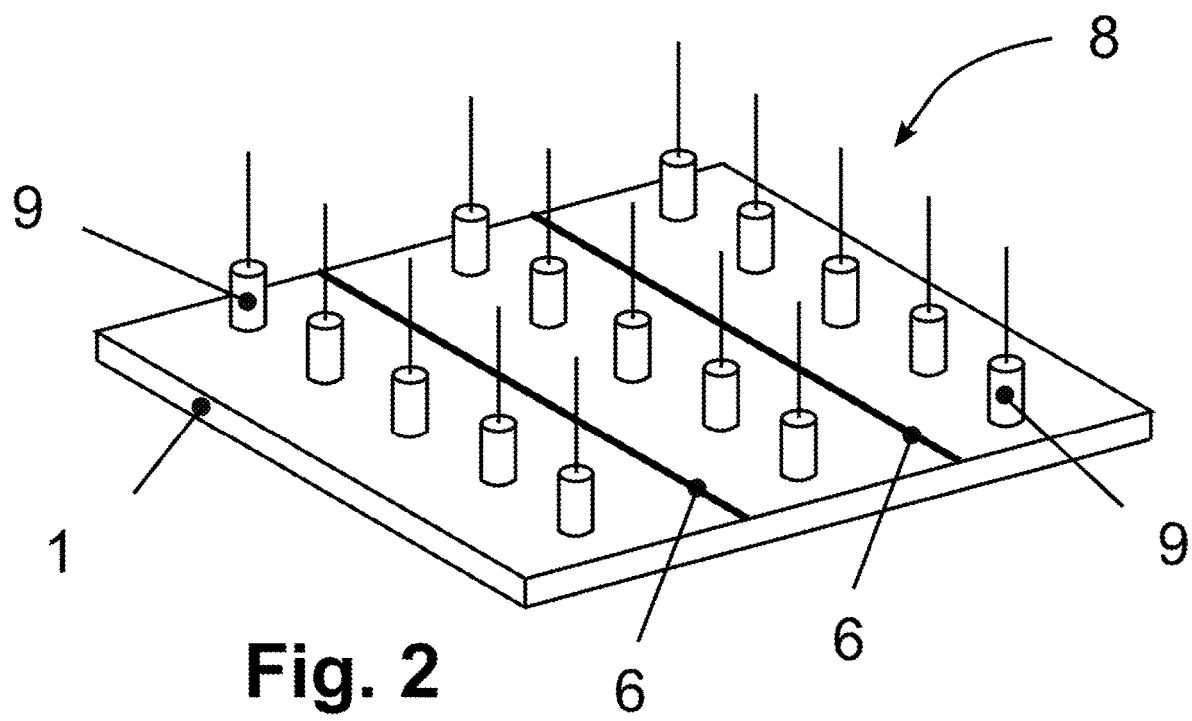
Figure 3:
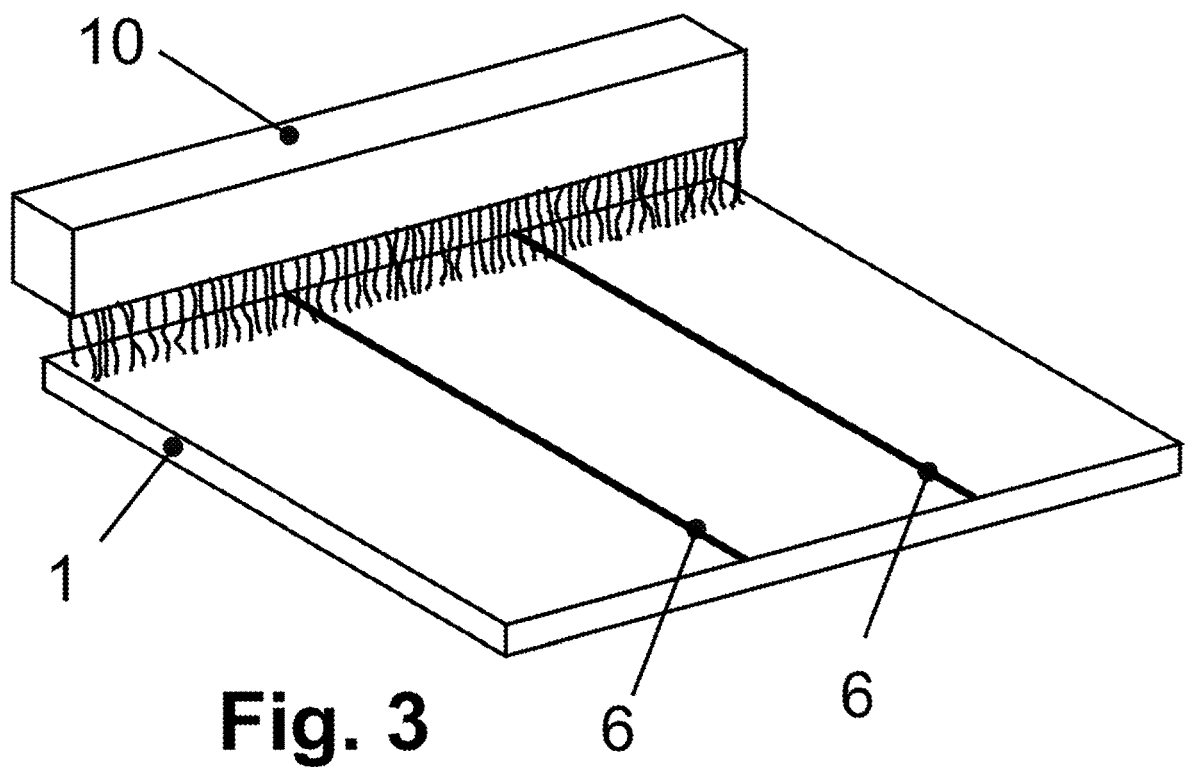
Figure 4:
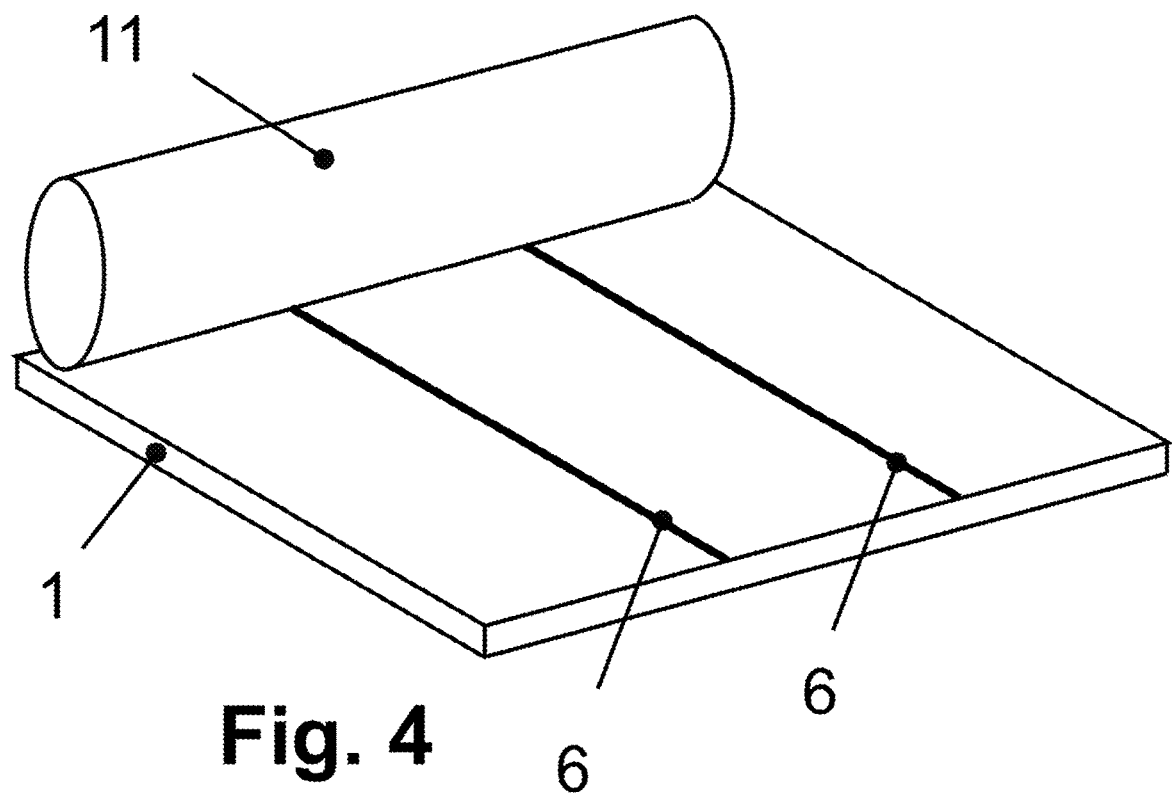
Figure 5:
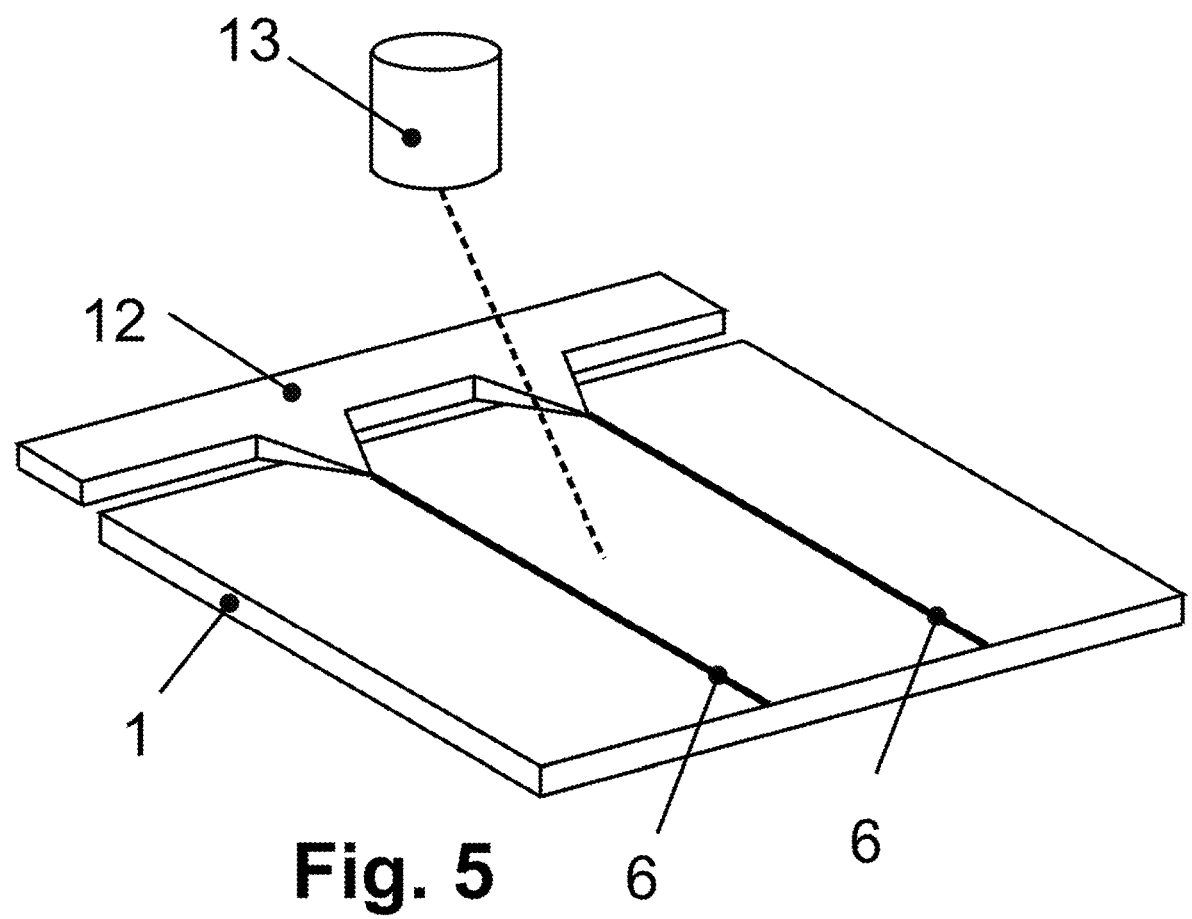

FIG. 2 A silicon solar cell with a contact-pin matrix placed on the contact grid FIG. 3 A silicon solar cell with a contact brush placed on the contact grid FIG. 4 A silicon solar cell with a contact roller placed on the contact grid FIG. 5 A silicon solar cell with the contact grid and a sun-facing side illuminated by a point light source.

FIG. 1 shows a schematic simplified structure of a silicon solar cell, 1. This has an absorber layer, 2, consisting of a p-doped silicon layer and an n-doped silicon layer, whereby a pn junction that typically exhibits a diode character is formed at the transition between the two layers. On a side of the silicon solar cell facing away from the sun, 1, a usually planar rear contact, 3, is applied to the p-doped silicon layer. On an opposite, sun-facing side of the silicon solar cell, 1, a dielectric silicon-nitride layer, 4, is usually arranged on the n-doped silicon layer. A contact grid, 5, consisting of metal paste is built up on this as described above. The contact grid, 5, of common silicon solar cells, 1, consists of busbars, 6, and contact fingers, 7, running transversely to them. As a result of the diode character of the pn junction, the silicon solar cell, 1, has forward direction and a breakdown voltage. In addition, the silicon solar cell, 1, is characterized by a short-circuit strength under standard test conditions (illuminance: 1,000 W/m$^2$, temperature of the silicon solar cell: 25° C.). A person having ordinary skill in the art will be familiar both with these parameters and with the standard test conditions, so they are not explained in detail here. Such a silicon solar cell, 1, is the starting point for the method according to the invention.

FIG. 2 shows the silicon solar cell, 1, with the contact grid, 5, schematically, whereby only the busbars, 6, and no contact fingers, 7, are illustrated in the figure. The side of the silicon solar cell, 1, facing away from the sun is not visible in the figure. After the silicon solar cell, 1, has been prepared, a first contacting device made up of a contact-pin matrix, 8, is placed on the contact grid, 5, whereby all contact pins, 9, of this matrix are electrically connected together. The contact pins, 9, rest on the contact fingers, 7, of the contact grid, 5. In principal, however, only the busbars, 6, or both the busbars, 6, and the contact fingers, 7, can also be contacted. Here, the contact pins, 9, can be sprung pins so that reliable contacting of the contact grid, 5, is ensured. Ideally, the contact pins, 9, are distributed homogeneously over the contact grid, 5. Alternatively, instead of the contact-pin matrix, 8, a contact plate can also be placed on the contact grid, 5, so that this is contacted over its whole area by the contact plate.

The next step of the method envisages placing a second contacting device on the rear contact, 3. This is not shown in the figure. The second contacting device can be, for example, a matrix of sprung pins or a metal plate for full-area contacting of the rear contact, 3. In terms of procedure, the second contacting device can also be put in place before the first contacting device.

The contact-pin matrix, 8, is connected to one pole of a current source. The second contacting device is connected to the second pole of that current source. The current source is not shown in the figure.

After putting the contact-pin matrix, 8, and the second contacting device in place, the current source induces a current pulse, whereby the current flows along the forward direction of the silicon solar cell, 1. The current pulse has a pulse length of 1 ms to 100 ms and a current magnitude in the range of 10-to-30 times the short-circuit current magnitude of the silicon solar cell, 1. In addition to the application of a current pulse, the application of a pulse sequence is also possible in principle. In this case, the individual current pulses can be of identical magnitudes. The pulses can also be of different magnitudes so that, for example, a current pulse with a pulse length of 50 ms and a current magnitude of 10 times the short-circuit current strength is first applied, followed by a current pulse with a pulse length of 5 ms and a current magnitude of 30 times the short-circuit current density. A silicon solar cell, 1, with a dimension of 15 cm×15 cm usually has a short-circuit current magnitude of 5-10 A. In this case, current magnitudes of 50-300 A are achieved for a current pulse in the method according to the invention. Contacting the contact grid, 5, with a contact-pin matrix, 8, or a contact plate ensures that current pulses with such high current magnitudes are distributed homogeneously over the whole silicon solar cell, 1, and the serial resistances associated with the lateral dimensions along the contact grid, 5, can be neglected.

At a low contact resistance between the contact grid, 5, and the emitter layer, a current pulse with currents and pulse lengths of the aforementioned orders of magnitude cause only slight heating at the transition between the contact grid, 5, and the emitter layer. The heating is essentially attributable to the power loss over the contact resistance. Slight heating has no influence on the ohmic-contact behaviour of the transition. However, if there is a high contact resistance between the contact grid, 5, and the emitter layer, the current pulse will result in a much higher power loss and therefore in a much greater heating of the transition. It is assumed that temperatures of the same order of magnitude as the temperatures used in the tempering process occur locally in the areas with small contact area between the contact grid, 5, and the emitter layer. This can cause local melting of the contact grid, 5, or the metal paste, which causes the metal paste to diffuse further through the silicon-nitride layer, 4, resulting in an increase in the contact area between the contact grid, 5, and the emitter layer and thus reducing the contact resistance. Limiting the time of the current pulses ensures that the heating-up time is limited so that the metal paste does not diffuse further through the emitter layer and destroy the structure of the absorber layer, 2, or even diffuse through to the rear contact, 3, of the silicon solar cell, 1, thereby short-circuiting the same.

The method according to the invention can be modified such that the contact grid, 5, is not in contact with a contact-pin matrix, 8, or a contact plate, but that a contact brush, 10 (FIG. 3), or a contact roller, 11 (FIG. 4), is placed on a subsection of the contact grid and is moved along the contact grid, 5.

FIG. 3 shows the silicon solar cell, 1, whereby a subsection of the contact grid, 5, is electrically contacted by a contact brush, 10, connected to one pole of a current source. Only the busbars, 6, and not the contact fingers, 7, of the contact grid, 5, are illustrated. The rear contact, 3, is electrically connected by a contacting device connected to the other pole of the current source, whereby the contacting device and the rear contact, 3, are not illustrated. After placing the contact brush, 10, on the contact grid, 5, the former is moved along the contact grid, 5. Here, the current source induces current pulses along the forward direction of the silicon solar cell, 1. The current pulses have a pulse length of 1 ms to 100 ms and a current of a magnitude corresponding to 10-to-30 times the short-circuit magnitude for the silicon solar cell, 1, reduced by the ratio of the area of the subsection to the area of the silicon solar cell, 1. For example, the subsection contacted by the contact brush, 10, can cover a quarter of the contact grid, 5. The magnitude of the current pulse applied in this case is around 2.5-to-7.5 times the magnitude of the short-circuit current. Alternatively to the pulsed current, a continuous current can also be used, whereby the time for which it is applied is regulated by the rate of forward motion of the contact brush.

The contact brush, 10, is guided continuously along the contact grid, 5. However, it is also possible to set down the contact brush, 10, on a subsection of the contact grid, 5, and to apply at least one current pulse first. The contact brush, 10, is then guided to another subsection of the contact grid, 5, and then at least one current pulse is applied. These steps are repeated according to the dimensions of the contact grid, 5. The bristles of the contact brush, 10, are designed such that no damage (such as scratches) is caused to the surface of the silicon solar cell, 1, while the contact brush, 10, is in motion.

FIG. 4 shows the silicon solar cell, 1, from FIG. 3 with the subsection of the contact grid, 5, electrically contacted by the contact roller, 11, instead of by the contact brush, 10. Only the busbars, 6, of the contact grid are illustrated. After placing the contact roller, 11, on the contact grid, 5, the former is moved along the contact grid, 5. Here, the current source induces current pulses along the forward direction of the silicon solar cell, 1. The current pulses have a pulse length of 1 ms to 100 ms and a current of a magnitude corresponding to 10-to-30 times the short-circuit magnitude for the silicon solar cell, 1, reduced by the ratio of the area of the subsection to the area of the silicon solar cell, 1. If, for example, the contact roller, 11, is designed such that the subsection encompasses around 10% of the contact grid, 5, a current magnitude of the order of one-to-three times the short-circuit current magnitude must be used for the current pulse. Alternatively to the pulsed current, a continuous current can also be used, whereby the time for which it is applied is regulated by the rate of forward motion of the contact roller.

The contact roller, 11, is also designed such that no damage (such as scratches) is caused to the surface of the silicon solar cell, 1, while the contact roller, 11, is in motion.

FIG. 5 shows an arrangement for an alternative method according to the invention. The alternative method comprises the following process steps: First, a silicon solar cell, 1, is prepared with the emitter layer, the contact grid, 5, and the rear contact, 3. The contact grid, 5, is then electrically connected to one pole of a voltage source and the rear contact, 3, is electrically connected to the other pole of the voltage source, whereby a point contacting of the contact grid, 5, is sufficient. Thus, placing a contact strip, 12, on the ends of the busbars, 6, suffices, for example. A voltage is then applied opposite to the forward direction of the silicon solar cell, 1, by the voltage source. The voltage should be less than the breakdown voltage of the silicon solar cell, 1. While this voltage is applied, a point light source, 13, is guided over the sun-facing side of the silicon solar cell, 1. The point illumination of subsections of the sun-facing side of the silicon solar cell, 1, generates a light-induced current that is amplified by the applied voltage source, which causes the aforementioned heating of the transition between the contact grid, 5, and the emitter layer. Here, it is an advantage that the contact grid, 5, need only be point contacted. Furthermore, selected areas of the silicon solar cell, 1, can be processed in a targeted manner. Thus, for example, areas with increased contact resistance can be detected by means of imaging processes, such as electroluminescence or CoreScan, and subjected to targeted treatment.

The point light source 13 is executed as a laser, although the method is not restricted to this. In this case, the laser can generate pulsed or continuous laser radiation. Diode lasers or $CO_2$ lasers can be used as low-cost variants, for example.

For a common silicon solar cell, an improvement of the ohmic-contact behaviour between the contact grid and the emitter layer is achieved with a reverse voltage of 12 V, a laser output of 0.5 W, a laser wavelength of 1,062 nm and a laser spot size of 60 μm, for example, whereby the current generated is of the order of 100 mA. If the silicon solar cell is scanned with a laser motion rate of 10 m/s and a line spacing of 1 mm, the process time is approximately 3 s.

LEGEND

1 Silicon solar cell
2 Absorber layer
3 Rear contact
4 Silicon-nitride layer
5 Contact grid
6 Busbar
7 Contact finger
8 Contact-pin matrix
9 Contact pin
10 Contact brush
11 Contact roller
12 Contact strip
13 Point light source

The invention claimed is:

1. A method for improving the ohmic-contact behaviour between a contact grid and an emitter layer of a silicon solar cell, the method comprising:
preparing a silicon solar cell having an emitter layer, a contact grid made of a metal paste and a rear contact;
electrically contacting the contact grid of the silicon solar cell with a first contacting device connected to one pole of a current source;
electrically contacting the rear contact of the silicon solar cell with a second contacting device connected to the other pole of the current source; and
inducing at least one current pulse with a pulse length of 1 ms to 100 ms and a current magnitude corresponding to 10-to-30 times the short-circuit magnitude of the silicon solar cell measured under standard test conditions along the forward direction of the silicon solar cell.

2. The method of claim 1, wherein the first contacting device is a contact-pin matrix or a contact plate.

3. A method for improving the ohmic-contact behaviour between a contact grid and an emitter layer of a silicon solar cell, the method comprising:
preparing a silicon solar cell having an emitter layer, a contact grid made of a metal paste and a rear contact;
electrically contacting a subsection of the contact grid of the silicon solar cell by means of a contact brush or contact roller connected to one pole of a current source;
electrically connecting the rear contact of the silicon solar cell by means of a contacting device connected to the other pole of the current source; and
guiding the contact brush or the contact roller over the contact grid and inducing a current flow along the forward direction of the silicon solar cell by means of the current source and exposing the subsection to the current flow for 1 ms to 100 ms, the current having a magnitude corresponding to 10-to-30 times the short-circuit magnitude of the silicon solar cell reduced by the ratio of the area of the subsection to the area of the silicon solar cell measured under standard test conditions.

4. A method for improving the ohmic-contact behaviour between a contact grid and an emitter layer of a silicon solar cell, the method comprising:
preparing a silicon solar cell having an emitter layer, a contact grid made of a metal paste and a rear contact;
electrically contacting the contact grid of the silicon solar cell to one pole of a voltage source;
connecting a contacting device, the contacting device being electrically connected to the other pole of the voltage source, to the rear contact of the silicon solar cell;
applying, with the voltage source, a voltage directed opposite to the forward direction of the silicon solar cell, the applied voltage being lower than the breakdown voltage;
guiding a point light source over the sun-facing side of the silicon solar cell while the voltage is applied; and
point illuminating a subsection of the sun-facing side, inducing a current to flow in the partial area, where the current acts on the subsection for 1 ms to 100 ms, the current being of a magnitude corresponding to 10-to-30 times the short-circuit current magnitude of the silicon solar cell reduced by the ratio of the area of the subsection to the area of the silicon solar cell measured under standard test conditions.

5. The method of claim 4, wherein the point light source is a laser.

* * * * *